United States Patent
Punzalan et al.

(10) Patent No.: US 8,039,947 B2
(45) Date of Patent: Oct. 18, 2011

(54) INTEGRATED CIRCUIT PACKAGE SYSTEM WITH DIFFERENT MOLD LOCKING FEATURES

(75) Inventors: Jeffrey D. Punzalan, Singapore (SG); Henry Descalzo Bathan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 276 days.

(21) Appl. No.: 11/749,693

(22) Filed: May 16, 2007

(65) Prior Publication Data

US 2007/0267731 A1    Nov. 22, 2007

Related U.S. Application Data

(60) Provisional application No. 60/747,435, filed on May 17, 2006, provisional application No. 60/803,982, filed on Jun. 5, 2006.

(51) Int. Cl.
| | |
|---|---|
| H01L 23/495 | (2006.01) |
| H01L 23/02 | (2006.01) |
| H01L 23/48 | (2006.01) |
| H01L 23/52 | (2006.01) |
| H01L 29/40 | (2006.01) |

(52) U.S. Cl. ........ 257/692; 257/678; 257/667; 257/690; 257/696; 257/773; 257/775

(58) Field of Classification Search ........... 257/692, 257/693, 696, 773, 786, 690, 694, 667, 678, 257/775

See application file for complete search history.

(56) References Cited

U.S. PATENT DOCUMENTS

| | | | | | |
|---|---|---|---|---|---|
| 5,233,131 | A | * | 8/1993 | Liang et al. | 174/538 |
| 5,654,585 | A | * | 8/1997 | Nishikawa | 257/666 |
| 5,736,432 | A | * | 4/1998 | Mackessy | 438/123 |
| 5,960,258 | A | | 9/1999 | Moden | |
| 6,448,633 | B1 | | 9/2002 | Yee et al. | |
| 6,977,431 | B1 | * | 12/2005 | Oh et al. | 257/696 |
| 7,009,282 | B2 | * | 3/2006 | Golick | 257/666 |
| 7,060,536 | B2 | * | 6/2006 | Punzalan et al. | 438/123 |
| 7,109,570 | B2 | * | 9/2006 | Manalac et al. | 257/666 |
| 7,112,252 | B2 | | 9/2006 | Kinsman et al. | |
| 7,473,584 | B1 | * | 1/2009 | Davis | 438/123 |
| 2002/0041010 | A1 | * | 4/2002 | Shibata | 257/666 |
| 2006/0180904 | A1 | * | 8/2006 | Ong | 257/676 |
| 2006/0201709 | A1 | | 9/2006 | McIver | |
| 2006/0234426 | A1 | * | 10/2006 | Lau | 438/127 |
| 2007/0090514 | A1 | * | 4/2007 | Condie et al. | 257/704 |
| 2007/0126092 | A1 | * | 6/2007 | San Antonio et al. | 257/674 |
| 2009/0014851 | A1 | * | 1/2009 | Choi et al. | 257/676 |
| 2009/0283893 | A1 | * | 11/2009 | Do et al. | 257/690 |

FOREIGN PATENT DOCUMENTS

JP            63289951 A    *  11/1988

* cited by examiner

*Primary Examiner* — Minh-Loan T Tran
*Assistant Examiner* — Teresa M Arroyo
(74) *Attorney, Agent, or Firm* — Mikio Ishimaru

(57) ABSTRACT

An integrated circuit package system is provided including forming a first inner lead having a first inner bottom side and a first outer lead, forming a first side lock of the first inner lead above the first inner bottom side, connecting an integrated circuit die with the first inner lead and the first outer lead, and encapsulating the integrated circuit die and the first side lock.

20 Claims, 7 Drawing Sheets

INTEGRATED CIRCUIT PACKAGE SYSTEM WITH DIFFERENT MOLD LOCKING FEATURES

CROSS-REFERENCE TO RELATED APPLICATIONS

This application claims the benefit of U.S. Provisional Patent Application No. 60/747,435 filed May 17, 2006, and also U.S. Provisional Patent Application No. 60/803,982 filed Jun. 5, 2006.

TECHNICAL FIELD

The present invention relates generally to an integrated circuit package system, and more particularly to an integrated circuit package system with an encapsulation.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These demanding requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat no-lead package ("QFN"). QFN packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with increased number of input/output (I/O) in high volume.

For example, dual row QFN packages are popular packages due to its high lead count capability but are required to accommodate larger semiconductor die sizes. Conventional dual row QFN packages provide staggered inner and outer leads for maximizing lead density. However, these packages do not address the need to provide mold locking solutions as well as the ability to handle larger chip sizes.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a first inner lead having a first inner bottom side and a first outer lead, forming a first side lock of the first inner lead above the first inner bottom side, connecting an integrated circuit die with the first inner lead and the first outer lead, and encapsulating the integrated circuit die and the first side lock.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
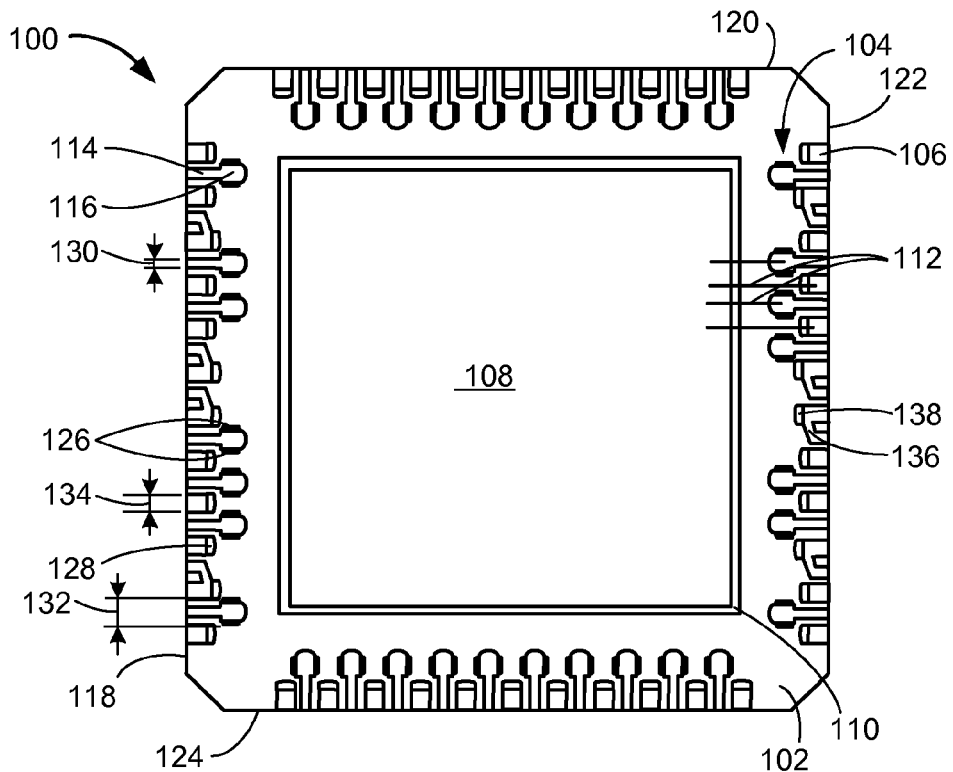
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in a first embodiment of the present invention. The plan view depicts the integrated circuit package system 100 without a top portion of an encapsulation 102, such as an epoxy molding compound. The plan view also depicts the integrated circuit package system 100 having dual rows of leads. The dual rows of leads include inner leads 104 and outer leads 106 offset or staggered from the inner leads 104.

For illustrative purposes, the integrated circuit package system 100 is shown having dual row of leads, although it is understood that the integrated circuit package system 100 may have more than dual rows of leads. For example, the integrated circuit package system 100 may have three rows of leads.

The inner leads 104 preferably extend more towards the interior of the integrated circuit package system 100 than the outer leads 106. An integrated circuit die 108 is shown preferably mounted over a paddle 110, such as a die-attach paddle, and is connected to predetermined selection of the inner leads 104 and the outer leads 106 with interconnects 112, such as bond wires or ribbon bond wires.

For illustrative purposes, the integrated circuit die 108 is shown in a square or approximately square geometric configuration, although it is understood that the integrated circuit die 108 may be formed in a different geometric configuration. For example, the integrated circuit die 108 may be formed in a rectangular geometric configuration having unequal sides.

Also for illustrative purposes, the paddle 110 is shown in a square or approximately square geometric configuration, although it is understood that the paddle 110 may be formed in a different geometric configuration. For example, the paddle 110 may be formed in a rectangular geometric configuration having unequal sides.

Further for illustrative purposes, the integrated circuit die 108 and the paddle 110 are shown having substantially the same or similar geometric configuration, although it is understood that the integrated circuit die 108 and the paddle 110 may have different geometric configurations from each other. Yet further for illustrative purposes, the integrated circuit die 108 is shown not overhanging the paddle 110, although it is understood that the integrated circuit die 108 may overhang the paddle 110.

Each of the inner leads 104 includes a non-contact portion 114 and a contact portion 116. The non-contact portion 114 extends from a first edge 118, a second edge 120, a third edge 122, and a fourth edge 124 of the integrated circuit package system 100 towards the interior and leading to the contact portion 116. The first edge 118 and the third edge 122 are at opposite side of the integrated circuit package system 100. Similarly, the second edge 120 and the fourth edge 124 are at opposite sides of the integrated circuit package system 100.

The interconnects 112 connect to the inner leads 104 at the contact portion 116. The contact portion 116 includes mold locking features, such as side locks 126. The inner leads 104 with the mold locking features will be described in more detailed later. Each of the outer leads 106 includes a mold locking feature, such as a front outer lock 128.

A non-contact width 130 of the non-contact portion 114 is preferably narrower than a contact width 132 of the contact portion 116. An outer width 134 of each of the outer leads 106 and the contact width 132 allow sufficient contact surface for reliably attaching the interconnects 112 to the outer leads 106 and the inner leads 104, respectively.

The contact portion 116 preferably extends beyond the outer leads 106 such that the inner leads 104 and the outer leads 106 are not in contact with each other avoiding inadvertent shorting. The non-contact width 130 being narrower than the contact width 132 enables maximizing input/output (I/O) density of the integrated circuit package system 100 with the dual rows of leads or specifically the inner leads 104 and the outer leads 106.

It has been discovered that the multiple types of mold locking features from both the inner leads 104 and the outer leads 106 allow the integrated circuit package system 100 to maximize the size of the integrated circuit die 108 that may be packaged and to maximize the I/O density. The side locks 126 of the inner leads 104 enable the integrated circuit package system 100 maximize the size of the integrated circuit die 108 within manufacturing tolerance. The front outer lock 128 of the outer leads 106 function as the mold locking feature while minimizing the impact or not impacting the I/O density.

The integrated circuit package system 100 may also have other connection structures to connect to the next system level (not shown), such as printed circuit board or another integrated circuit package system. For example, the integrated circuit package system 100 may have fused leads 136 shown in the same row as the outer leads 106. Multiple terminals of the integrated circuit package system 100 may be fused together forming one of the fused leads 136. The fused leads 136 may also have mold locking features, such as a front fused lock 138.

The fused leads 136 may serve a number of functions, such as providing supplement current sink or current source paths compared to the outer leads 106 or the inner leads 104. For illustrative purposes, the outer leads 106 and the fused leads 136 are shown having the same type of mold locking features, although it is understood that the outer leads 106 and the fused leads 136 may have different types of mold locking features from each other.

The first edge 118 and the third edge 122 have the inner leads 104, the outer leads 106, and the fused leads 136. The second edge 120 and the fourth edge 124 have the inner leads 104 in alternating locations with the outer leads 106.

The encapsulation 102 is covers the integrated circuit die 108, the paddle 110, and the interconnects 112. The encapsulation 102 partially exposes the inner leads 104 and the outer leads 106 to ambient for connection with the next system level.

Figure 2:
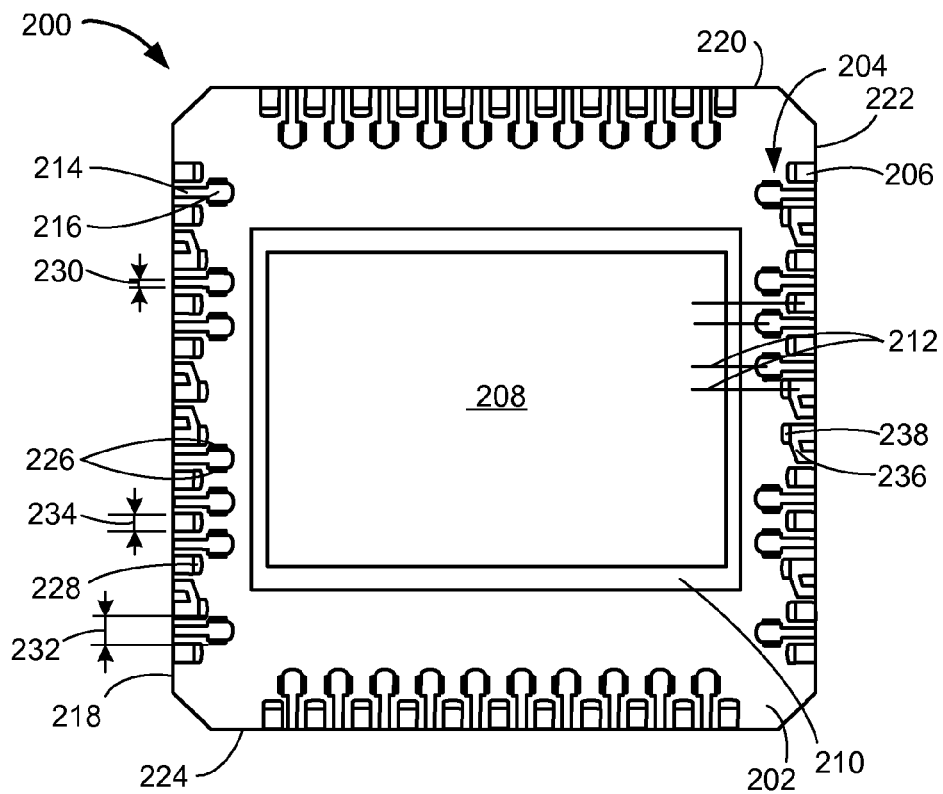
FIG. 2 is a plan view of an integrated circuit package system in a second embodiment of the present invention.

Referring now to FIG. 2, therein is shown a plan view of an integrated circuit package system 200 in a second embodiment of the present invention. The plan view depicts the integrated circuit package system 200 without a top portion of an encapsulation 202, such as an epoxy molding compound. The plan view also depicts the integrated circuit package system 200 having dual rows of leads. The dual rows of leads include inner leads 204 and outer leads 206.

For illustrative purposes, the integrated circuit package system 200 is shown having dual row of leads, although it is understood that the integrated circuit package system 200 may have more than dual rows of leads. For example, the integrated circuit package system 200 may have three rows of leads.

The inner leads 204 preferably extend more towards the interior of the integrated circuit package system 200 than the outer leads 206. An integrated circuit die 208 is shown preferably mounted over a paddle 210, such as a die-attach paddle, and is connected to predetermined selection of the inner leads 204 and the outer leads 206 with interconnects 212, such as bond wires or ribbon bond wires.

For illustrative purposes, the integrated circuit die 208 is shown in a non-square or rectangular geometric configuration, although it is understood that the integrated circuit die 208 may be formed in a different geometric configuration.

Also for illustrative purposes, the paddle 210 is shown in a non-square or rectangular geometric configuration, although it is understood that the paddle 210 may be formed in a different geometric configuration.

Further for illustrative purposes, the integrated circuit die 208 and the paddle 210 are shown having substantially the same or similar geometric configuration, although it is understood that the integrated circuit die 208 and the paddle 210 may have different geometric configurations from each other. Yet further for illustrative purposes, the integrated circuit die 208 is shown not overhanging the paddle 210, although it is understood that the integrated circuit die 208 may overhang the paddle 210.

Each of the inner leads 204 includes a non-contact portion 214 and a contact portion 216. The non-contact portion 214 extends from a first edge 218, a second edge 220, a third edge 222, and a fourth edge 224 of the integrated circuit package system 200 towards the interior and leading to the contact portion 216. The first edge 218 and the third edge 222 are at opposite sides of the integrated circuit package system 200. Similarly, the second edge 220 and the fourth edge 224 are at opposite sides of the integrated circuit package system 200.

The interconnects 212 connect to the inner leads 204 at the contact portion 216. The contact portion 216 includes mold locking features, such as side locks 226. Each of the outer leads 206 includes a mold locking feature, such as a front outer lock 228.

A non-contact width 230 of the non-contact portion 214 is preferably narrower than a contact width 232 of the contact portion 216. An outer width 234 of each of the outer leads 206 and the contact width 232 allow sufficient contact surface for reliably attaching the interconnects 212 to the outer leads 206 and the inner leads 204, respectively.

The contact portion 216 preferably extends beyond the outer leads 206 such that the inner leads 204 and the outer leads 206 are not in contact with each other avoiding inadvertent shorting. The non-contact width 230 being narrower than the contact width 232 enables maximizing input/output (I/O) density of the integrated circuit package system 200 with the dual rows of leads or specifically the inner leads 204 and the outer leads 206.

It has been discovered that the multiple types of mold locking features from both the inner leads 204 and the outer leads 206 allow the integrated circuit package system 200 to maximize the size of the integrated circuit die 208 that may be packaged and to maximize the I/O density. The side locks 226 of the inner leads 204 enable the integrated circuit package system 200 maximize the size of the integrated circuit die 208 within manufacturing tolerance. The front outer lock 228 of the outer leads 206 function as the mold locking feature while minimizing the impact or not impacting the I/O density.

The integrated circuit package system 200 may also have other connection structures to connect to the next system level (not shown), such as printed circuit board or another integrated circuit package system. For example, the integrated circuit package system 200 may have fused leads 236 shown in the same row as the outer leads 206. Multiple terminals of the integrated circuit package system 200 may be fused together forming one of the fused leads 236. The fused leads 236 may also have mold locking features, such as a front fused lock 238.

The fused leads 236 may serve a number of functions, such as providing supplement current sink or current source paths compared to the outer leads 206 or the inner leads 204. For illustrative purposes, the outer leads 206 and the fused leads 236 are shown having the same type of mold locking features, although it is understood that the outer leads 206 and the fused leads 236 may have different types of mold locking features from each other.

The first edge 218 and the third edge 222 have the inner leads 204, the outer leads 206, and the fused leads 236. The second edge 220 and the fourth edge 224 have the inner leads 204 in alternating locations with the outer leads 206. The first edge 218 and the third edge 222 are shown preferably parallel to the shorter sides of the paddle 210 and the integrated circuit die 208. The second edge 220 and the fourth edge 224 are shown preferably parallel to the longer sides of the paddle 210 and the integrated circuit die 208.

The encapsulation 202 is covers the integrated circuit die 208, the paddle 210, and the interconnects 212. The encapsulation 202 partially exposes the inner leads 204 and the outer leads 206 to ambient for connection with the next system level.

Figure 3:
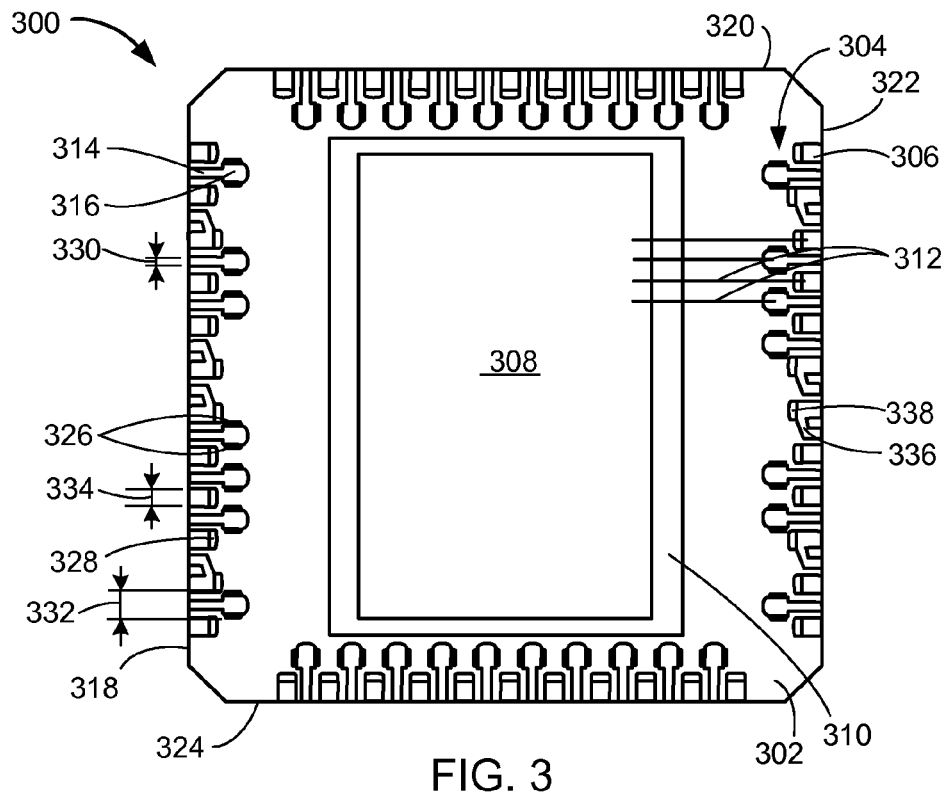
FIG. 3 is a plan view of an integrated circuit package system in a third embodiment of the present invention.

Referring now to FIG. 3, therein is shown a plan view of an integrated circuit package system in a third embodiment of the present invention. The plan view depicts an integrated circuit package system 300 without a top portion of an encapsulation 302, such as an epoxy molding compound. The plan view also depicts the integrated circuit package system 300 having dual rows of leads. The dual rows of leads include inner leads 304 and outer leads 306.

For illustrative purposes, the integrated circuit package system 300 is shown having dual row of leads, although it is understood that the integrated circuit package system 300 may have more than dual rows of leads. For example, the integrated circuit package system 300 may have three rows of leads.

The inner leads 304 preferably extend more towards the interior of the integrated circuit package system 300 than the outer leads 306. An integrated circuit die 308 is shown preferably mounted over a paddle 310, such as a die-attach paddle, and is connected to predetermined selection of the inner leads 304 and the outer leads 306 with interconnects 312, such as bond wires or ribbon bond wires.

For illustrative purposes, the integrated circuit die 308 is shown in a non-square or rectangular geometric configuration, although it is understood that the integrated circuit die 308 may be formed in a different geometric configuration. Also for illustrative purposes, the paddle 310 is shown in a non-square or rectangular geometric configuration, although it is understood that the paddle 310 may be formed in a different geometric configuration.

Further for illustrative purposes, the integrated circuit die 308 and the paddle 310 are shown having substantially the same or similar geometric configuration, although it is understood that the integrated circuit die 308 and the paddle 310 may have different geometric configurations from each other. Yet further for illustrative purposes, the integrated circuit die 308 is shown not overhanging the paddle 310, although it is understood that the integrated circuit die 308 may overhang the paddle 310.

Each of the inner leads 304 includes a non-contact portion 314 and a contact portion 316. The non-contact portion 314 extends from a first edge 318, a second edge 320, a third edge 322, and a fourth edge 324 of the integrated circuit package system 300 towards the interior and leading to the contact portion 316. The first edge 318 and the third edge 322 are at opposite sides of the integrated circuit package system 300. Similarly, the second edge 320 and the fourth edge 324 are at opposite sides of the integrated circuit package system 300.

The interconnects 312 connect to the inner leads 304 at the contact portion 316. The contact portion 316 includes mold locking features, such as side locks 326. Each of the outer leads 306 includes a mold locking feature, such as a front outer lock 328.

A non-contact width 330 of the non-contact portion 314 is preferably narrower than a contact width 332 of the contact portion 316. An outer width 334 of each of the outer leads 306 and the contact width 332 allow sufficient contact surface for reliably attaching the interconnects 312 to the outer leads 306 and the inner leads 304, respectively.

The contact portion 316 preferably extends beyond the outer leads 306 such that the inner leads 304 and the outer leads 306 are not in contact with each other avoiding inadvertent shorting. The non-contact width 330 being narrower than the contact width 332 enables maximizing input/output (I/O) density of the integrated circuit package system 300 with the dual rows of leads or specifically the inner leads 304 and the outer leads 306.

It has been discovered that the multiple types of mold locking features from both the inner leads 304 and the outer leads 306 allow the integrated circuit package system 300 to maximize the size of the integrated circuit die 308 that may be packaged and to maximize the I/O density. The side locks 326 of the inner leads 304 enable the integrated circuit package system 300 maximize the size of the integrated circuit die 308 within manufacturing tolerance. The front outer lock 328 of the outer leads 306 function as the mold locking feature while minimizing the impact or not impacting the I/O density.

The integrated circuit package system 300 may also have other connection structures to connect to the next system level (not shown), such as printed circuit board or another integrated circuit package system. For example, the integrated circuit package system 300 may have fused leads 336 shown in the same row as the outer leads 306. Multiple terminals of the integrated circuit package system 300 may be fused together forming one of the fused leads 336. The fused leads 336 may also have mold locking features, such as a front fused lock 338.

The fused leads 336 may serve a number of functions, such as providing supplement current sink or current source paths compared to the outer leads 306 or the inner leads 304. For illustrative purposes, the outer leads 306 and the fused leads 336 are shown having the same type of mold locking features, although it is understood that the outer leads 306 and the fused leads 336 may have different types of mold locking features from each other.

The first edge 318 and the third edge 322 have the inner leads 304, the outer leads 306, and the fused leads 336. The second edge 320 and the fourth edge 324 have the inner leads 304 in alternating locations with the outer leads 306. The first edge 318 and the third edge 322 are shown preferably parallel to the longer sides of the paddle 310 and the integrated circuit die 308. The second edge 320 and the fourth edge 324 are shown preferably parallel to the shorter sides of the paddle 310 and the integrated circuit die 308.

The encapsulation 302 is covers the integrated circuit die 308, the paddle 310, and the interconnects 312. The encapsulation 302 partially exposes the inner leads 304 and the outer leads 306 to ambient for connection with the next system level.

Figure 4:
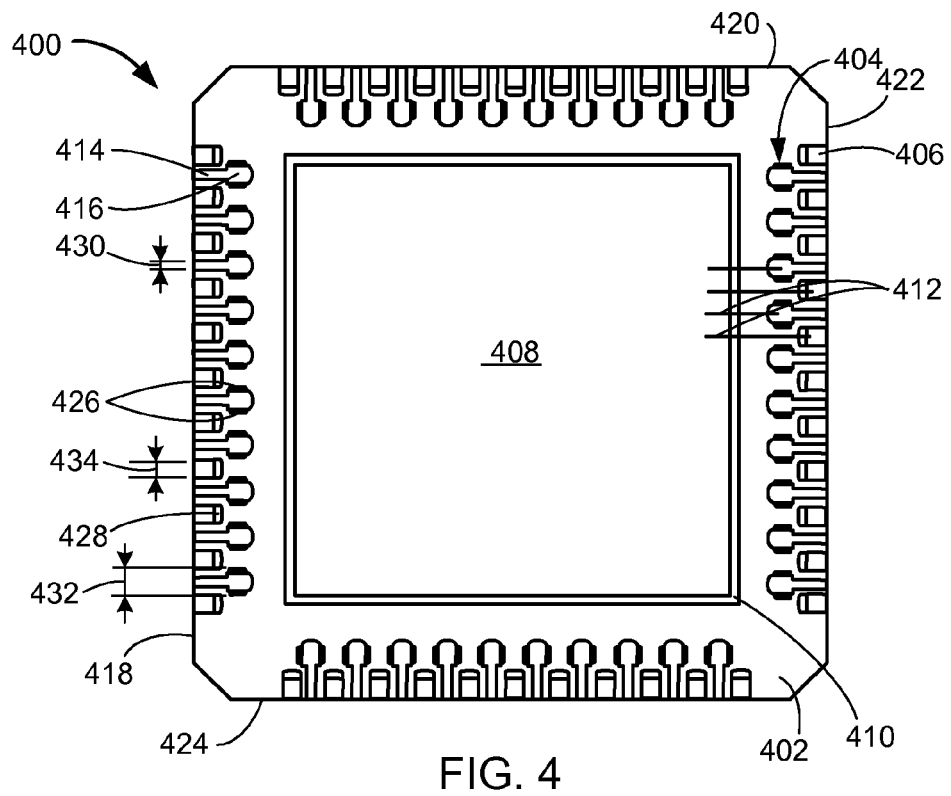
FIG. 4 is a plan view of an integrated circuit package system in a fourth embodiment of the present invention.

Referring now to FIG. 4, therein is shown a plan view of an integrated circuit package system 400 in a fourth embodiment of the present invention. The plan view depicts the integrated circuit package system 400 without a top portion of an encapsulation 402, such as an epoxy molding compound. The plan view also depicts the integrated circuit package system 400 having dual rows of leads. The dual rows of leads include inner leads 404 and outer leads 406.

For illustrative purposes, the integrated circuit package system 400 is shown having dual row of leads, although it is understood that the integrated circuit package system 400 may have more than dual rows of leads. For example, the integrated circuit package system 400 may have three rows of leads.

The inner leads 404 preferably extend more towards the interior of the integrated circuit package system 400 than the outer leads 406. An integrated circuit die 408 is shown preferably mounted over a paddle 410, such as a die-attach paddle, and is connected to predetermined selection of the inner leads 404 and the outer leads 406 with interconnects 412, such as bond wires or ribbon bond wires.

For illustrative purposes, the integrated circuit die 408 is shown in a square or approximately square geometric configuration, although it is understood that the integrated circuit die 408 may be formed in a different geometric configuration. For example, the integrated circuit die 408 may be formed in a rectangular geometric configuration having unequal sides.

Also for illustrative purposes, the paddle 410 is shown in a square or approximately square geometric configuration, although it is understood that the paddle 410 may be formed in a different geometric configuration. For example, the paddle 410 may be formed in a rectangular geometric configuration having unequal sides.

Further for illustrative purposes, the integrated circuit die 408 and the paddle 410 are shown having substantially the same or similar geometric configuration, although it is understood that the integrated circuit die 408 and the paddle 410 may have different geometric configurations from each other. Yet further for illustrative purposes, the integrated circuit die 408 is shown not overhanging the paddle 410, although it is understood that the integrated circuit die 408 may overhang the paddle 410.

Each of the inner leads 404 includes a non-contact portion 414 and a contact portion 416. The non-contact portion 414 extends from a first edge 418, a second edge 420, a third edge 422, and a fourth edge 424 of the integrated circuit package system 400 towards the interior and leading to the contact portion 416. The first edge 418 and the third edge 422 are at opposite side of the integrated circuit package system 400. Similarly, the second edge 420 and the fourth edge 424 are at opposite sides of the integrated circuit package system 400.

The interconnects 412 connect to the inner leads 404 at the contact portion 416. The contact portion 416 includes mold locking features, such as side locks 426. The inner leads 404 with the mold locking features will be described in more detailed later. Each of the outer leads 406 includes a mold locking feature, such as a front outer lock 428.

A non-contact width 430 of the non-contact portion 414 is preferably narrower than a contact width 432 of the contact portion 416. An outer width 434 of each of the outer leads 406 and the contact width 432 allow sufficient contact surface for reliably attaching the interconnects 412 to the outer leads 406 and the inner leads 404, respectively.

The contact portion 416 preferably extends beyond the outer leads 406 such that the inner leads 404 and the outer leads 406 are not in contact with each other avoiding inadvertent shorting. The non-contact width 430 being narrower than the contact width 432 enables maximizing input/output (I/O) density of the integrated circuit package system 400 with the dual rows of leads or specifically the inner leads 404 and the outer leads 406. The first edge 418, the second edge 420, the third edge 422, and the fourth edge 424 have the inner leads 404 in alternating locations with the outer leads 406.

It has been discovered that the multiple types of mold locking features from both the inner leads 404 and the outer leads 406 allow the integrated circuit package system 400 to maximize the size of the integrated circuit die 408 that may be packaged and to maximize the I/O density. The side locks 426 of the inner leads 404 enable the integrated circuit package system 400 maximize the size of the integrated circuit die 408 within manufacturing tolerance. The front outer lock 428 of the outer leads 406 function as the mold locking feature while minimizing the impact or not impacting the I/O density.

The encapsulation 402 is covers the integrated circuit die 408, the paddle 410, and the interconnects 412. The encapsulation 402 partially exposes the inner leads 404 and the outer leads 406 to ambient for connection with the next system level.

Figure 5:
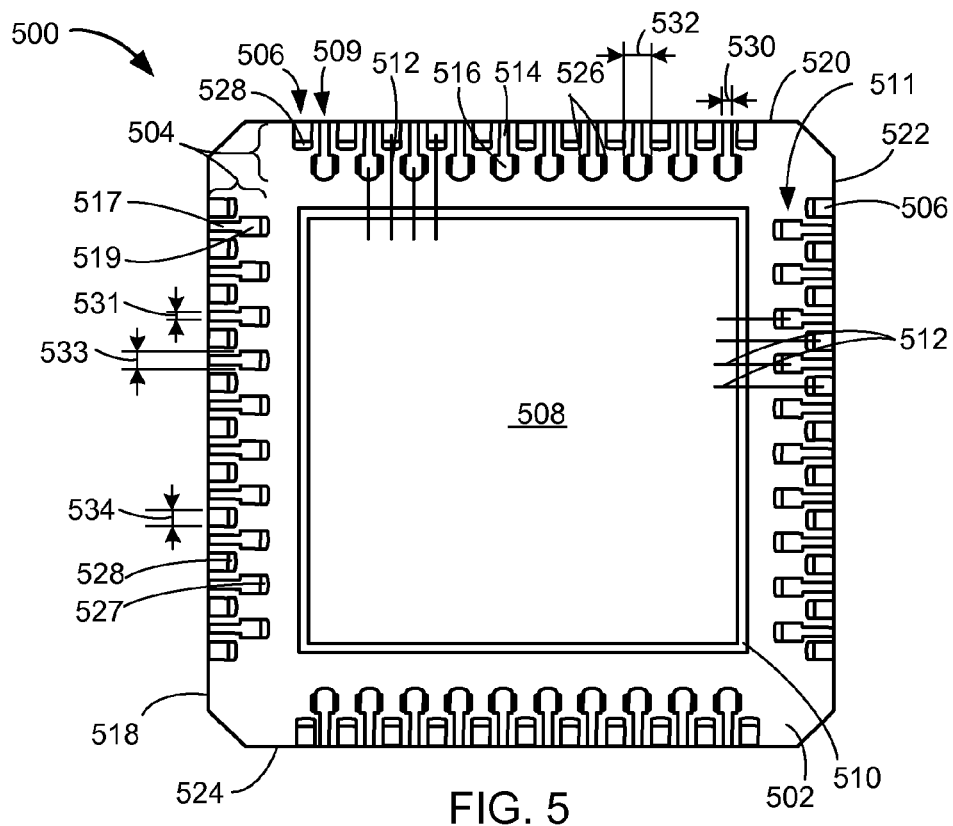
FIG. 5 is a plan view of an integrated circuit package system in a fifth embodiment of the present invention.

Referring now to FIG. 5, therein is shown a plan view of an integrated circuit package system 500 in a fifth embodiment of the present invention. The plan view depicts the integrated circuit package system 500 without a top portion of an encapsulation 502, such as an epoxy molding compound. The plan view also depicts the integrated circuit package system 500 having dual rows of leads. The dual rows of leads include inner leads 504 and outer leads 506.

For illustrative purposes, the integrated circuit package system 500 is shown having dual row of leads, although it is understood that the integrated circuit package system 500 may have more than dual rows of leads. For example, the integrated circuit package system 500 may have three rows of leads.

The inner leads 504 preferably extend more towards the interior of the integrated circuit package system 500 than the outer leads 506. An integrated circuit die 508 is shown preferably mounted over a paddle 510, such as a die-attach paddle, and is connected to predetermined selection of the inner leads 504 and the outer leads 506 with interconnects 512, such as bond wires or ribbon bond wires.

For illustrative purposes, the integrated circuit die 508 is shown in a square or approximately square geometric configuration, although it is understood that the integrated circuit die 508 may be formed in a different geometric configuration. For example, the integrated circuit die 508 may be formed in a rectangular geometric configuration having unequal sides.

Also for illustrative purposes, the paddle 510 is shown in a square or approximately square geometric configuration, although it is understood that the paddle 510 may be formed in a different geometric configuration. For example, the paddle 510 may be formed in a rectangular geometric configuration having unequal sides.

Further for illustrative purposes, the integrated circuit die 508 and the paddle 510 are shown having substantially the same or similar geometric configuration, although it is understood that the integrated circuit die 508 and the paddle 510 may have different geometric configurations from each other. Yet further for illustrative purposes, the integrated circuit die 508 is shown not overhanging the paddle 510, although it is understood that the integrated circuit die 508 may overhang the paddle 510.

The inner leads 504 include first leads 509 and second leads 511. Each of first inner leads 513 includes a first non-contact portion 514 and a first contact portion 516. Each of second inner leads 515 includes a second non-contact portion 517 and a second contact portion 519. The integrated circuit package system 500 includes a first edge 518, a second edge 520, a third edge 522, and a fourth edge 524. The first edge 518 and the third edge 522 are at opposite side of the integrated circuit package system 500. Similarly, the second edge 520 and the fourth edge 524 are at opposite sides of the integrated circuit package system 500.

The first non-contact portion 514 extends from the second edge 520 and the fourth edge 524 towards the interior of the integrated circuit package system 500 and leading to the first contact portion 516. The second non-contact portion 517 extends from the first edge 518 and the third edge 522 towards the interior of the integrated circuit package system 500 and leading to the second contact portion 519.

The first edge 518 and the third edge 522 have the second leads 511 in alternating locations with the outer leads 506. The second edge 520 and the fourth edge 524 have the first leads 509 in alternating locations with the outer leads 506.

The interconnects 512 connect to the first leads 509 at the first contact portion 516. The interconnects 512 also connect to the second leads 511 at the second contact portion 519. The first contact portion 516 includes mold locking features, such as side locks 526. The second contact portion 519 includes mold locking features, such as a front inner lock 527. The front inner lock 527 may extend as an overhang, from a top side of the second contact portion 519, toward the integrated circuit die 508. Each of the outer leads 506 includes a mold locking feature, such as a front outer lock 528. The front outer lock 528 may extend as an overhang, from the top side of the outer leads 506, toward the first integrated circuit die 508.

A first non-contact width 530 of the first non-contact portion 514 is preferably narrower than a first contact width 532 of the first contact portion 516. A second non-contact width 531 of the second non-contact portion 517 is preferably narrower than a second contact width 533 of the second contact portion 519. An outer width 534 of each of the outer leads 506, the first contact width 532, the second contact width 533 allow sufficient contact surface for reliably attaching the interconnects 512 to the outer leads 506, the first leads 509, and the second leads 511, respectively.

The first contact portion 516 and the second contact portion 519 preferably extend beyond the outer leads 506 such that the inner leads 504 and the outer leads 506 are not in contact with each other avoiding inadvertent shorting. The first non-contact width 530 being narrower than the first contact width 532 as well as the second non-contact width 531 being narrower than the second contact width 533 enables maximizing input/output (I/O) density of the integrated circuit package system 500 with the dual rows of leads or specifically the inner leads 504 and the outer leads 506.

It has been discovered that the multiple types of mold locking features from both the inner leads 504 and the outer leads 506 allow the integrated circuit package system 500 to maximize the size of the integrated circuit die 508 that may be packaged and to maximize the I/O density. The side locks 526 of the inner leads 504 enable the integrated circuit package system 500 maximize the size of the integrated circuit die 508 within manufacturing tolerance. The front outer lock 528 of the outer leads 506 functions as the mold locking feature while minimizing the impact or not impacting the I/O density.

The encapsulation 502 is covers the integrated circuit die 508, the paddle 510, and the interconnects 512. The encapsulation 502 partially exposes the inner leads 504 and the outer leads 506 to ambient for connection with the next system level.

Figure 6:
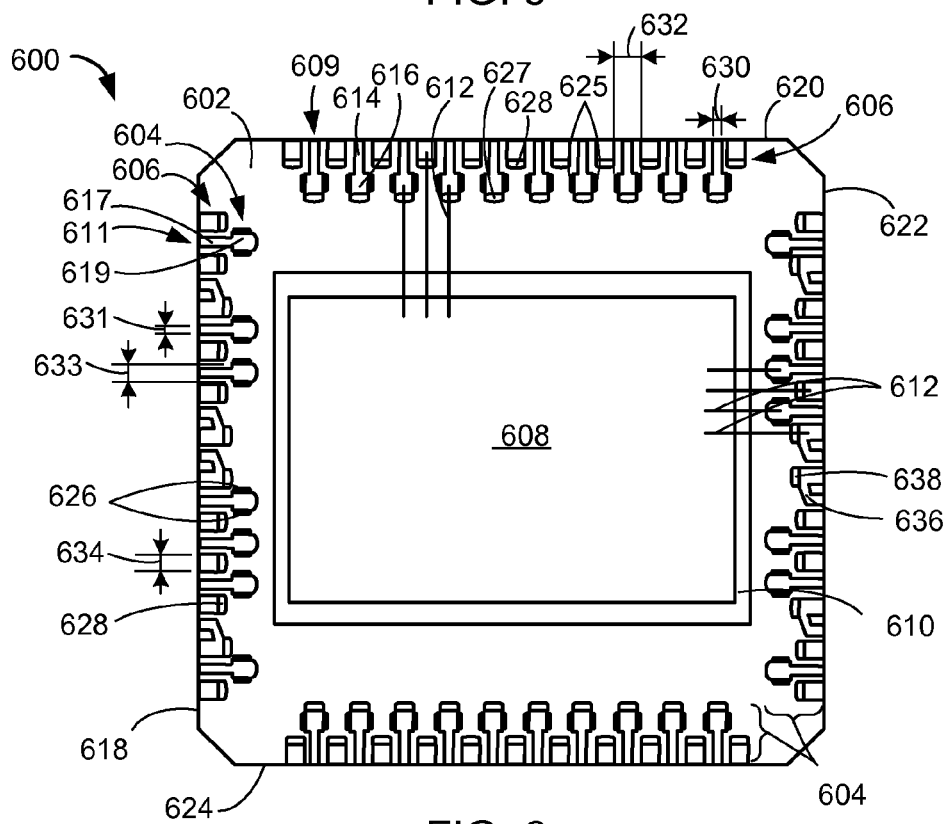
FIG. 6 is a plan view of an integrated circuit package system in a sixth embodiment of the present invention.

Referring now to FIG. 6, therein is shown a plan view of an integrated circuit package system 600 in a sixth embodiment of the present invention. The plan view depicts the integrated circuit package system 600 without a top portion of an encapsulation 602, such as an epoxy molding compound. The plan view also depicts the integrated circuit package system 600 having dual rows of leads. The dual rows of leads include inner leads 604 and outer leads 606.

For illustrative purposes, the integrated circuit package system 600 is shown having dual row of leads, although it is understood that the integrated circuit package system 600 may have more than dual rows of leads. For example, the integrated circuit package system 600 may have three rows of leads.

The inner leads 604 preferably extend more towards the interior of the integrated circuit package system 600 than the outer leads 606. An integrated circuit die 608 is shown preferably mounted over a paddle 610, such as a die-attach paddle, and is connected to predetermined selection of the inner leads 604 and the outer leads 606 with interconnects 612, such as bond wires or ribbon bond wires.

For illustrative purposes, the integrated circuit die 608 is shown in a non-square or rectangular geometric configuration, although it is understood that the integrated circuit die 608 may be formed in a different geometric configuration. Also for illustrative purposes, the paddle 610 is shown in a non-square or rectangular geometric configuration, although it is understood that the paddle 610 may be formed in a different geometric configuration.

Further for illustrative purposes, the integrated circuit die 608 and the paddle 610 are shown having substantially the same or similar geometric configuration, although it is understood that the integrated circuit die 608 and the paddle 610 may have different geometric configurations from each other. Yet further for illustrative purposes, the integrated circuit die 608 is shown not overhanging the paddle 610, although it is understood that the integrated circuit die 608 may overhang the paddle 610.

The inner leads 604 include first leads 609 and second leads 611. Each of the first leads 609 includes a first non-contact portion 614 and a first contact portion 616. Each of the second leads 611 includes a second non-contact portion 617 and a second contact portion 619. The integrated circuit package system 600 includes a first edge 618, a second edge 620, a third edge 622, and a fourth edge 624. The first edge 618 and the third edge 622 are at opposite side of the integrated circuit package system 600. Similarly, the second edge 620 and the fourth edge 624 are at opposite sides of the integrated circuit package system 600.

The first non-contact portion 614 extends from the second edge 620 and the fourth edge 624 towards the interior of the integrated circuit package system 600 and leading to the first contact portion 616. The second non-contact portion 617 extends from the first edge 618 and the third edge 622 towards the interior of the integrated circuit package system 600 and leading to the second contact portion 619.

The interconnects 612 connect to the first leads 609 at the first contact portion 616. The interconnects 612 also connect to the second leads 611 at the second contact portion 619. The first contact portion 616 includes mold locking features, such as first side locks 625 and a front inner lock 627. The second contact portion 619 includes mold locking features, such as second side locks 626. Each of the outer leads 606 includes a mold locking feature, such as a front outer lock 628.

A first non-contact width 630 of the first non-contact portion 614 is preferably narrower than a first contact width 632 of the first contact portion 616. A second non-contact width 631 of the second non-contact portion 617 is preferably narrower than a second contact width 633 of the second contact portion 619. An outer width 634 of each of the outer leads 606, the first contact width 632, the second contact width 633 allow sufficient contact surface for reliably attaching the interconnects 612 to the outer leads 606, the first leads 609, and the second leads 611, respectively.

The first contact portion 616 and the second contact portion 619 preferably extend beyond the outer leads 606 such that the inner leads 604 and the outer leads 606 are not in contact with each other avoiding inadvertent shorting. The first non-contact width 630 being narrower than the first contact width 632 as well as the second non-contact width 631 being narrower than the second contact width 633 enables maximizing input/output (I/O) density of the integrated circuit package system 600 with the dual rows of leads or specifically the inner leads 604 and the outer leads 606.

It has been discovered that the multiple types of mold locking features from both the inner leads 604 and the outer leads 606 allow the integrated circuit package system 600 to maximize the size of the integrated circuit die 608 that may be packaged and to maximize the I/O density. The first side locks 625 and the front inner lock 627 of the first leads 609 of the inner leads 604 allows for additional mold locking features for sides of the integrated circuit package system 600 not space constrained due to the rectangular geometric configuration of the integrated circuit die 608. The second side locks 626 of the second leads 611 of the inner leads 604 enable the integrated circuit package system 600 maximize the size of the integrated circuit die 608 within manufacturing tolerance. The front outer lock 628 of the outer leads 606 function as the mold locking feature while minimizing the impact or not impacting the I/O density.

The integrated circuit package system 600 may also have other connection structures to connect to the next system level (not shown), such as printed circuit board or another integrated circuit package system. For example, the integrated circuit package system 600 may have fused leads 636 shown in the same row as the outer leads 606. Multiple terminals of the integrated circuit package system 600 may be fused together forming one of the fused leads 636. The fused leads 636 may also have mold locking features, such as a front fused lock 638.

The fused leads 636 may serve a number of functions, such as providing supplement current sink or current source paths compared to the outer leads 606 or the inner leads 604. For illustrative purposes, the outer leads 606 and the fused leads 636 are shown having the same type of mold locking features, although it is understood that the outer leads 606 and the fused leads 636 may have different types of mold locking features from each other.

The first edge 618 and the third edge 622 have the second leads 611, the outer leads 606, and the fused leads 636. The second edge 620 and the fourth edge 624 have the first leads 609 in alternating locations with the outer leads 606. The first edge 618 and the third edge 622 are shown preferably parallel to the shorter sides of the paddle 610 and the integrated circuit die 608. The second edge 620 and the fourth edge 624 are shown preferably parallel to the longer sides of the paddle 610 and the integrated circuit die 608.

The encapsulation 602 is covers the integrated circuit die 608, the paddle 610, and the interconnects 612. The encapsulation 602 partially exposes the inner leads 604 and the outer leads 606 to ambient for connection with the next system level.

Figure 7:
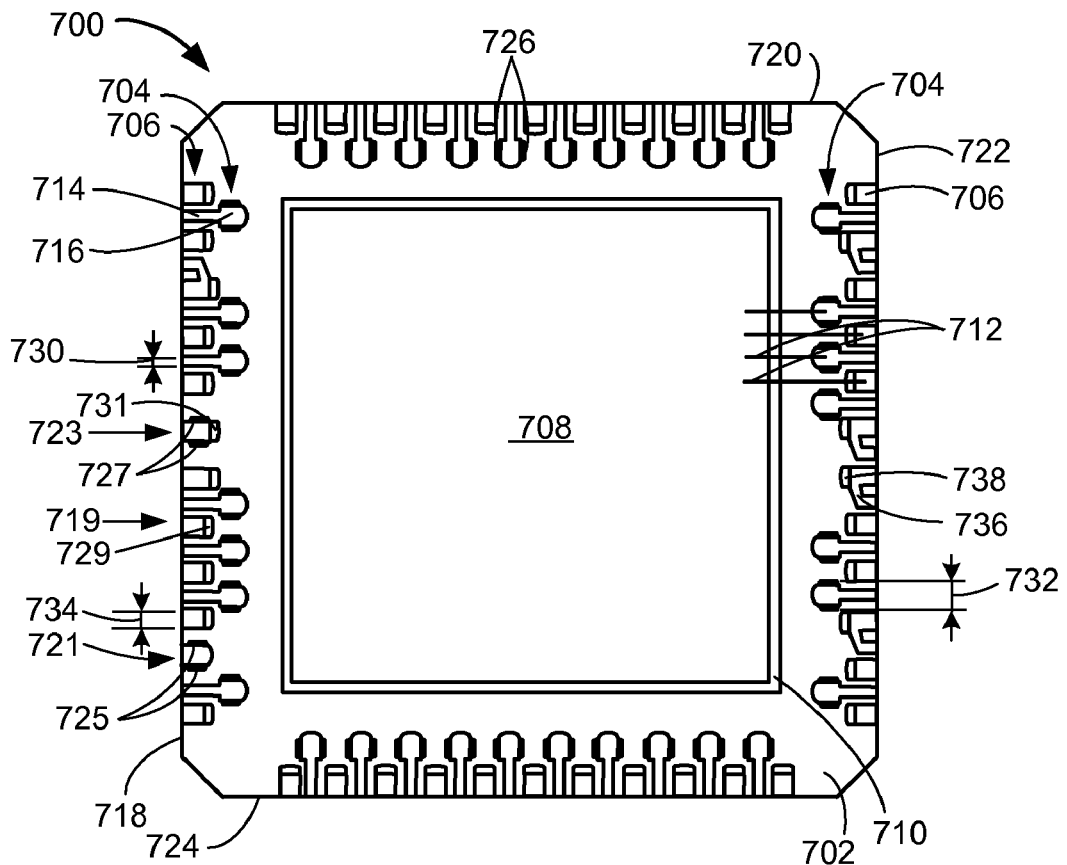
FIG. 7 is a plan view of an integrated circuit package system in a seventh embodiment of the present invention.

Referring now to FIG. 7, therein is shown a plan view of an integrated circuit package system 700 in a seventh embodiment of the present invention. The plan view depicts the integrated circuit package system 700 without a top portion of an encapsulation 702, such as an epoxy molding compound. The plan view also depicts the integrated circuit package system 700 having dual rows of leads. The dual rows of leads include inner leads 704 and outer leads 706.

For illustrative purposes, the integrated circuit package system 700 is shown having dual row of leads, although it is understood that the integrated circuit package system 700 may have more than dual rows of leads. For example, the integrated circuit package system 700 may have three rows of leads.

The inner leads 704 preferably extend more towards the interior of the integrated circuit package system 700 than the outer leads 706. An integrated circuit die 708 is shown preferably mounted over a paddle 710, such as a die-attach paddle, and is connected to predetermined selection of the inner leads 704 and the outer leads 706 with interconnects 712, such as bond wires or ribbon bond wires.

For illustrative purposes, the integrated circuit die 708 is shown in a square or approximately square geometric configuration, although it is understood that the integrated circuit die 708 may be formed in a different geometric configuration. For example, the integrated circuit die 708 may be formed in a rectangular geometric configuration having unequal sides.

Also for illustrative purposes, the paddle 710 is shown in a square or approximately square geometric configuration, although it is understood that the paddle 710 may be formed in a different geometric configuration. For example, the paddle 710 may be formed in a rectangular geometric configuration having unequal sides.

Further for illustrative purposes, the integrated circuit die 708 and the paddle 710 are shown having substantially the same or similar geometric configuration, although it is understood that the integrated circuit die 708 and the paddle 710 may have different geometric configurations from each other. Yet further for illustrative purposes, the integrated circuit die 708 is shown not overhanging the paddle 710, although it is understood that the integrated circuit die 708 may overhang the paddle 710.

Each of the inner leads 704 includes a non-contact portion 714 and a contact portion 716. The non-contact portion 714 extends from a first edge 718, a second edge 720, a third edge 722, and a fourth edge 724 of the integrated circuit package system 700 towards the interior and leading to the contact portion 716. The first edge 718 and the third edge 722 are at opposite side of the integrated circuit package system 700. Similarly, the second edge 720 and the fourth edge 724 are at opposite sides of the integrated circuit package system 700.

The interconnects 712 connect to the inner leads 704 at the contact portion 716. The contact portion 716 includes mold locking features, such as side locks 726. The inner leads 704 with the mold locking features will be described in more detailed later.

The integrated circuit package system 700 include different types of the outer leads 706, such as a first lead 719, a second lead 721, and a third lead 723. The first lead 719 includes a first front outer lock 729. The second lead 721 includes first side locks 725. The third lead 723 includes a second side locks 727 and second front outer lock 731.

A non-contact width 730 of the non-contact portion 714 is preferably narrower than a contact width 732 of the contact portion 716. A first outer width 734 of the first lead 719 and the contact width 732 allow sufficient contact surface for reliably attaching the interconnects 712 to the first lead 719 and the inner leads 704, respectively. The second lead 721 and the third lead 723 may be interspersed amongst the outer leads 706 providing mold locking features without impacting the I/O density.

The contact portion 716 preferably extends beyond the outer leads 706 such that the inner leads 704 and the outer leads 706 are not in contact with each other avoiding inadvertent shorting. The non-contact width 730 being narrower than the contact width 732 enables maximizing input/output (I/O) density of the integrated circuit package system 700 with the dual rows of leads or specifically the inner leads 704 and the outer leads 706.

It has been discovered that the multiple types of mold locking features from both the inner leads 704 and the outer leads 706 allow the integrated circuit package system 700 to maximize the size of the integrated circuit die 708 that may be packaged and to maximize the I/O density. The side locks 726 of the inner leads 704 enable the integrated circuit package system 700 maximize the size of the integrated circuit die 708 within manufacturing tolerance. The first front outer lock 729, the first side locks 725, the second front outer lock 731, and the second side locks 727 of the outer leads 706 function as the mold locking feature while minimizing the impact or not impacting the I/O density.

The integrated circuit package system 700 may also have other connection structures to connect to the next system level (not shown), such as printed circuit board or another integrated circuit package system. For example, the integrated circuit package system 700 may have fused leads 736 shown in the same row as the outer leads 706. Multiple terminals of the integrated circuit package system 700 may be fused together forming one of the fused leads 736. The fused leads 736 may also have mold locking features, such as a front fused lock 738.

The fused leads 736 may serve a number of functions, such as providing supplement current sink or current source paths compared to the outer leads 706 or the inner leads 704. For illustrative purposes, the outer leads 706 and the fused leads 736 are shown having the same type of mold locking features, although it is understood that the outer leads 706 and the fused leads 736 may have different types of mold locking features from each other.

The first edge 718 and the third edge 722 have the inner leads 704, the outer leads 706, and the fused leads 736. The second edge 720 and the fourth edge 724 have the inner leads 704 in alternating locations with the outer leads 706.

The encapsulation 702 is covers the integrated circuit die 708, the paddle 710, and the interconnects 712. The encapsulation 702 partially exposes the inner leads 704 and the outer leads 706 to ambient for connection with the next system level.

Figure 8:
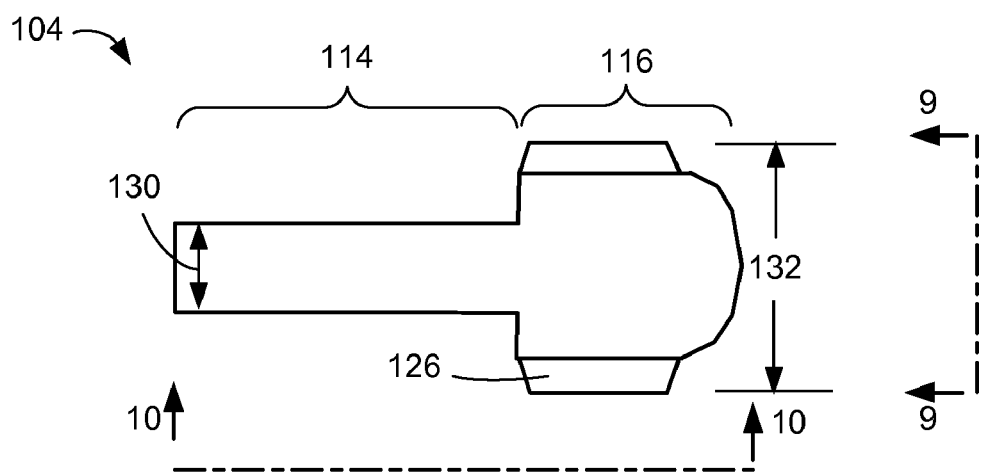
FIG. 8 is a top view of one of the inner leads of the integrated circuit package system of FIG. 1.

Referring now to FIG. 8, therein is shown a top view of one of the inner leads 104 of the integrated circuit package system 100 of FIG. 1. The top view depicts the contact portion 116 having the contact width 132 and the non-contact portion 114 having the non-contact width 130. The contact portion 116 extends beyond the side locks 126 from the non-contact portion 114.

Figure 9:
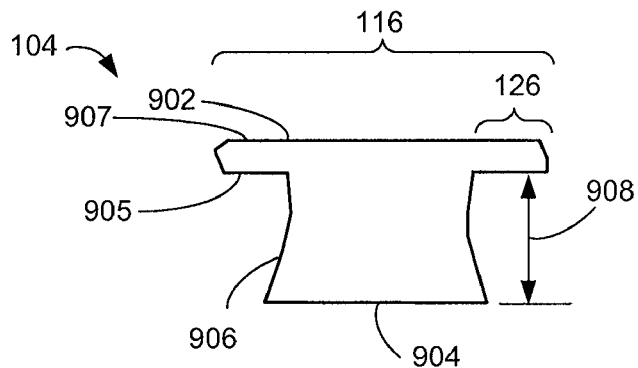
FIG. 9 is a front view of one of the inner leads along line 9-9 of FIG. 8.

Referring now to FIG. 9, therein is shown a front view of one of the inner leads 104 along line 9-9 of FIG. 8. The front view depicts a top side 902 of the inner leads 104 and a bottom side 904 of the contact portion 116. The top side 902 having the side locks 126 that extend laterally from the top side 902 to increase the contact width 132, of FIG. 1, preferably is wider that the bottom side 904 helping form the mold locking feature of the inner leads 104. Contoured sides 906, formed from the bottom side 904 to a lock bottom side 905 of the side locks 126 also preferably contribute to the mold locking feature of the inner leads 104. The lock bottom side 905 is parallel to a lock top side 907 of the side locks 126. The lock top side 907 is coplanar to the top side 902.

The side locks 126 and the contoured sides 906 may be formed by a number of different ways. For example, the inner leads 104 may be anisotropically etched from the bottom side 904. A side height 908 depicts the distance between the bottom side 904 and the bottom of the side locks 126.

Figure 10:
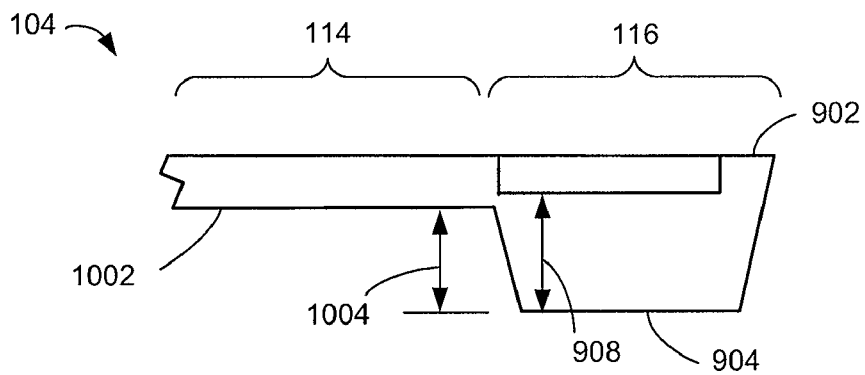
FIG. 10 is a side view of one of the inner leads along line 10-10 of FIG. 8.

Referring now to FIG. 10, therein is shown a side view of one of the inner leads 104 along line 10-10 of FIG. 8. The side view depicts one of the inner leads 104 with the bottom side 904 of the contact portion 116 and the top side 902. The side view also depicts the non-contact portion 114 having an elevated side 1002. An elevation height 1004 depicts the distance between the bottom side 904 and the elevated side 1002. As an example, the side height 908 and the elevation height 1004 are shown not equal.

The elevated side 1002 of the non-contact portion 114 may be formed by a number of different ways. For example, the non-contact portion 114 may be etched from a side opposite the top side 902 forming the elevated side 1002.

Figure 11:
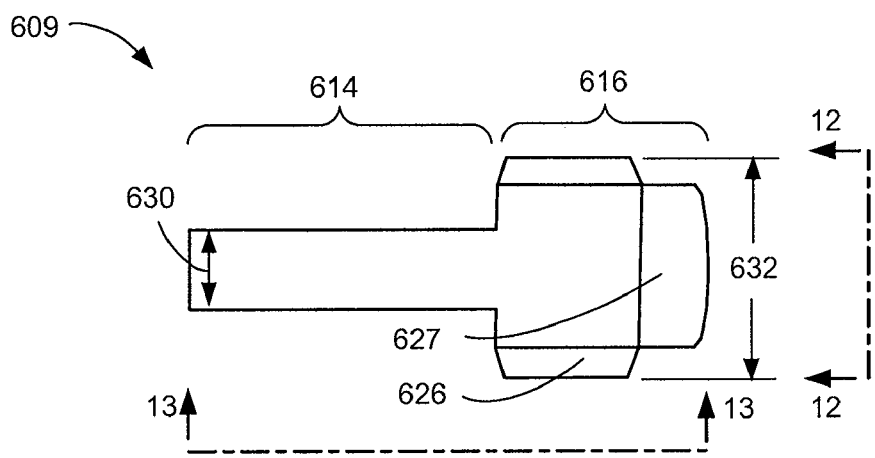
FIG. 11 is a top view of one of the first leads of the integrated circuit package system of FIG. 6.

Referring now to FIG. 11, therein is shown a top view of one of the first leads 609 of the integrated circuit package system 600 of FIG. 6. The top view depicts the first contact portion 616 having the first contact width 632 and the first non-contact portion 614 having the first non-contact width 630. The first contact portion 616 includes the first side locks 625 and the front inner lock 627.

Figure 12:
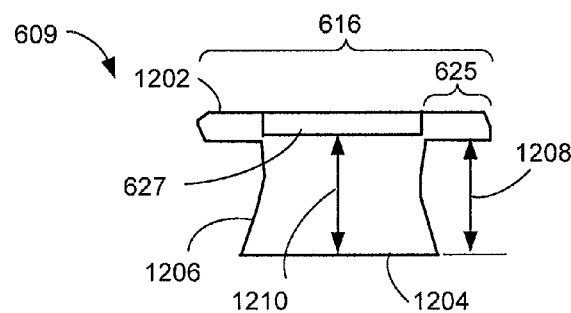
FIG. 12 is a front view of one of the first leads along line 12-12 of FIG. 11.

Referring now to FIG. 12, therein is shown a front view of one of the first leads 609 along line 12-12 of FIG. 11. The front view depicts a top side 1202 of the first leads 609 and a bottom side 1204 of the first contact portion 616. The top side 1202 having the first side locks 625 preferably extends beyond the bottom side 1204 helping form the mold locking feature of the first leads 609. The top side 1202 also has the front inner lock 627 above the bottom side 1204 also helping form the mold locking feature of the first leads 609. Contoured sides 1206 from the bottom side 1204 to below the second side locks 626 also preferably contribute to the mold locking feature of the first leads 609.

The first side locks 625, the front inner lock 627, and the contoured sides 1206 may be formed by a number of different ways. For example, the first leads 609 may be anisotropically etched from the bottom side 1204. A side height 1208 depicts the distance between the bottom side 1204 and the bottom of the second side locks 626. A front height 1210 depicts the distance between the bottom side 1204 and the front inner lock 627. For illustrative purposes, the side height 1208 and the front height 1210 are shown substantially the same, although it is understood that the side height 1208 and the front height 1210 may be different.

Figure 13:
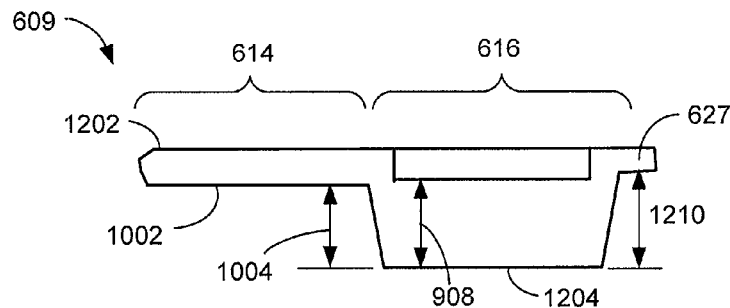
FIG. 13 is a side view of one of the first leads along line 13-13 of FIG. 11.

Referring now to FIG. 13, therein is shown a side view of one of the first leads 609 along line 13-13 of FIG. 11. The side view depicts one of the first leads 609 with the bottom side 1204 of the first contact portion 616 and the top side 1202. The side view also depicts the first non-contact portion 614 having the elevated side 1002. The elevation height 1004 depicts the distance between the bottom side 904 and the elevated side 1002. As an example, the side height 908 and the front height 1210, as measured between the bottom side 1204 and the front inner lock 627, are shown not equal to the elevation height 1004. The front inner lock 627 is substantially similar to the front outer lock 628, of FIG. 6, and protrudes as an overhang from the top side 1202 toward the integrated circuit die 608, of FIG. 6. The outer lead 606, of FIG. 6, does not include the side locks 625, of FIG. 6, but the front outer lock 628 protrudes as an overhang substantially similar to the front inner lock 627.

The elevated side 1002 of the first non-contact portion 614 may be formed by a number of different ways. For example, the first non-contact portion 614 may be etched from a side opposite the top side 1202 forming the elevated side 1002.

Figure 14:
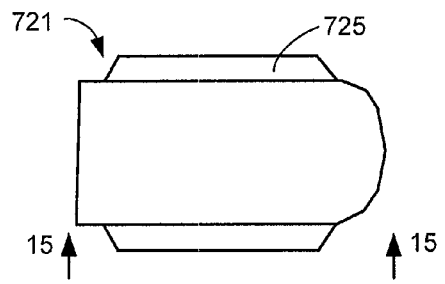
FIG. 14 is a top view of the second lead of the integrated circuit package system of FIG. 7.

Referring now to FIG. 14, therein is shown a top view of the second lead 721 of the integrated circuit package system 700 of FIG. 7. The top view depicts the first side locks 725 extending from the sides of the second lead 721.

Figure 15:
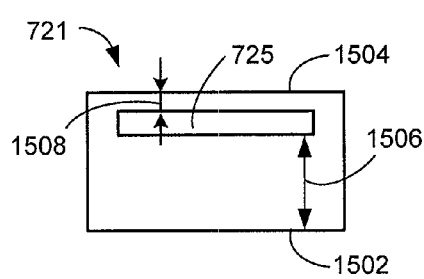
FIG. 15 is a side view of the second lead along line 15-15 of FIG. 14.

Referring now to FIG. 15, therein is shown a side view of the second lead 721 along line 15-15 of FIG. 14. The side view depicts the second lead 721 with a bottom side 1502 and a top side 1504. A side bottom height 1506 depicts the distance between the bottom side 1502 and the bottom of the first side locks 725. A side top height 1508 depicts the distance between the top side 1504 and the top of the first side locks 725.

Figure 16:
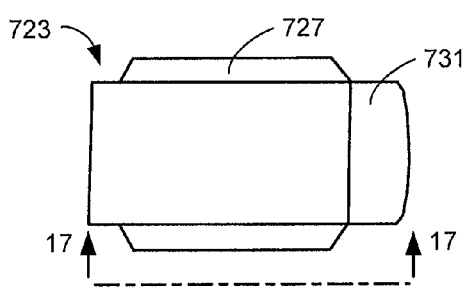
FIG. 16 is a top view of the third lead of the integrated circuit package system of FIG. 7.

Referring now to FIG. 16, therein is shown a top view of the third lead 723 of the integrated circuit package system 700 of FIG. 7. The top view depicts the second side locks 727 extending from the sides of the third lead 723 and the second front outer lock 731 extending towards the interior of the integrated circuit package system 700.

Figure 17:
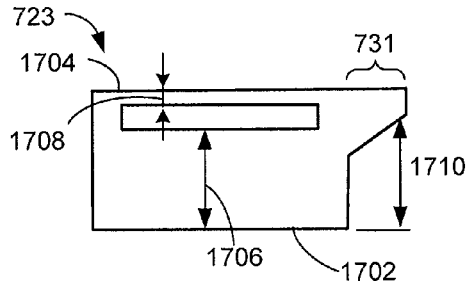
FIG. 17 is a side view of the third lead along line 17-17 of FIG. 16.

Referring now to FIG. 17, therein is shown a side view of the third lead 723 along line 17-17 of FIG. 16. The side view depicts the third lead 723 with a bottom side 1702 and a top side 1704. A side bottom height 1706 depicts the distance between the bottom side 1702 and the bottom of the second side locks 727. A side top height 1708 depicts the distance between the top side 1704 and the top of the second side locks 727. A front height 1710 depicts the distance between the bottom side 1702 and the bottom of the second front outer lock 731.

Figure 18:
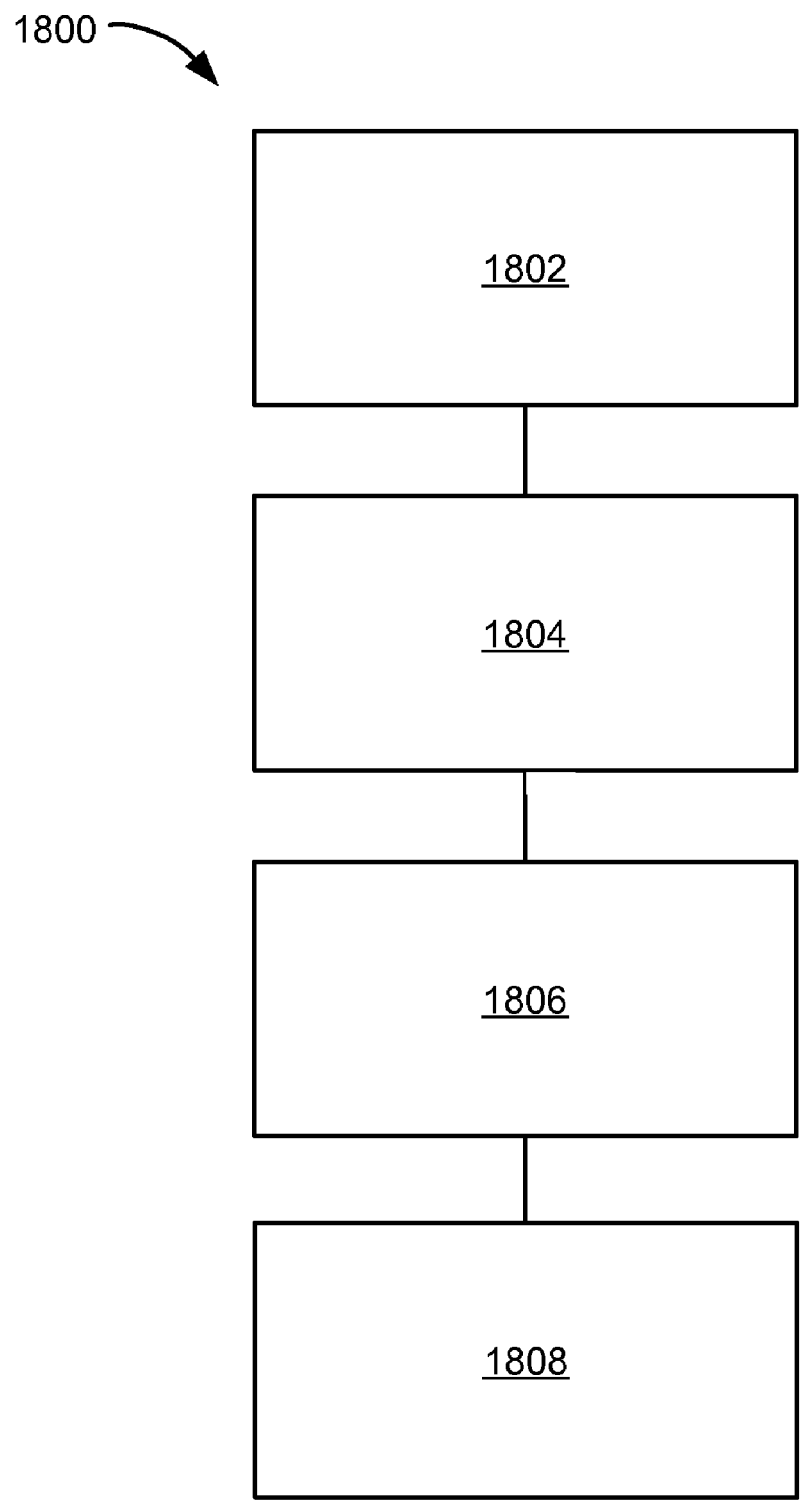
FIG. 18 is a flow chart of an integrated package system for manufacturing the integrated circuit package system in an embodiment of the present invention.

Referring now to FIG. 18, therein is shown a flow chart of an integrated circuit package system 1800 for manufacturing the integrated circuit package system 100 in an embodiment of the present invention. The system 1800 includes forming a first inner lead having a first inner bottom side and a first outer lead in a block 1802; forming a first side lock of the first inner lead above the first inner bottom side in a block 1804; connecting an integrated circuit die with the first inner lead and the first outer lead in a block 1806; and encapsulating the integrated circuit die and the first side lock in a block 1808.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:

forming a first inner lead having a top side and a first inner bottom side;

forming an outer lead offset from the first inner lead;

forming a first side lock extending laterally from the first inner lead, the first side lock having a lock bottom side parallel to a lock top side coplanar to the top side with a contoured side between the first side lock and the first inner bottom side;

connecting an integrated circuit die with the first inner lead and the first outer lead; and encapsulating the integrated circuit die and the first side lock.

2. The method as claimed in claim 1 further comprising forming a front inner lock, of the first inner lead above the first inner bottom side, extending toward the first integrated circuit die.

3. The method as claimed in claim 1 wherein forming the outer lead includes forming a second lead having a second side lock above a first bottom side of the outer lead.

4. The method as claimed in claim 1 wherein forming the outer lead includes forming a third lead having a second side lock and a front lock above a first bottom side of the outer lead.

5. The method as claimed in claim 1 wherein forming the first side lock above a first inner bottom side includes forming a front inner lock extending toward the integrated circuit die.

6. A method of manufacture of an integrated circuit package system comprising:

forming a first inner lead having a top side and a first inner bottom side;

forming an outer lead offset from the first inner lead;

forming a first side lock extending laterally from the first inner lead, the first side lock having a lock bottom side parallel to a lock top side coplanar to the top side with a contoured side between the first side lock and the first inner bottom side;

forming a front outer lock of the outer lead including protruding as an overhang from a top side of the outer lead;

connecting an integrated circuit die with the first inner lead and the first outer lead; and encapsulating the integrated circuit die and the first side lock.

7. The method as claimed in claim 6 wherein:

forming the first inner lead includes:

forming a contact portion having a contact width integral with a non-contact portion and having the contact width greater than the non-contact width; and forming the first side lock includes:

forming the first side lock from the contact portion.

8. The method as claimed in claim 6 wherein:

forming the first inner lead includes:

forming a contact portion having a contact width integral with a non-contact portion and having the contact width greater than the non-contact width; and further comprising:

forming a front lock from the contact portion above the first inner bottom side.

9. The method as claimed in claim 6 wherein connecting the integrated circuit die includes connecting the integrated circuit die having a rectangular geometric configuration.

10. The method as claimed in claim 6 wherein:
forming the first inner lead includes:
- forming a contact portion having a contact width integral with a non-contact portion and having the contact width greater than the non-contact width; and further comprising:
- forming an elevated side of the non-contact portion above the first inner bottom side.

11. An integrated circuit package system comprising:
an outer lead;
a first inner lead having a top side and a first inner bottom side adjacent to the first outer lead with a first side lock laterally extended from the top side of the first inner lead, the first side lock having a lock bottom side parallel to a lock top side coplanar to the top side with a contoured side between the first side lock and the first inner bottom side;
an integrated circuit die connected to the first inner lead and the first outer lead; and
an encapsulation over the integrated circuit die and the first side lock.

12. The system as claimed in claim 11 wherein the first inner lead includes a front inner lock above the first inner bottom side extending toward the integrated circuit die.

13. The system as claimed in claim 11 wherein the outer lead includes a second outer lead with a second side lock above a first bottom side of the first outer lead.

14. The system as claimed in claim 11 wherein the outer lead includes a third outer lead with second side lock and a front lock above a first bottom side of the first outer lead.

15. The system as claimed in claim 11 wherein the first side lock above the first inner bottom side includes a front inner lock extended toward the integrated circuit die.

16. The system as claimed in claim 11 wherein:
the first outer lead has a first front lock; and
the encapsulation is over the first front lock.

17. The system as claimed in claim 16 wherein the first inner lead includes a contact portion having a contact width integral with a non-contact portion and having the contact width greater than the non-contact width; and the contact portion includes the first side lock.

18. The system as claimed in claim 16 wherein the first inner lead includes a contact portion having a contact width integral with a non-contact portion and having the contact width greater than the non-contact width; and the contact portion includes a front lock above the first inner bottom side.

19. The system as claimed in claim 16 wherein the integrated circuit die has a rectangular geometric configuration.

20. The system as claimed in claim 16 wherein the first inner lead includes a contact portion having a contact width integral with a non-contact portion and having the contact width greater than the non-contact width; and the non-contact portion includes an elevated side above the first inner bottom side.

* * * * *

UNITED STATES PATENT AND TRADEMARK OFFICE
CERTIFICATE OF CORRECTION

PATENT NO. : 8,039,947 B2  
APPLICATION NO. : 11/749693  
DATED : October 18, 2011  
INVENTOR(S) : Punzalan et al.

Page 1 of 1

It is certified that error appears in the above-identified patent and that said Letters Patent is hereby corrected as shown below:

Column 15:
line 58, delete "wider that the bottom side" and insert therefor --wider than the bottom side--

Column 20:
claim 17, line 13, delete "width; and the non-contact" and insert therefor --width, and the non-contact-- claim 18, line 18, delete "width; and the non-contact" and insert therefor --width, and the non-contact-- claim 20, line 25, delete "width; and the non-contact" and insert therefor --width, and the non-contact--

Signed and Sealed this
Fifth Day of June, 2012

David J. Kappos
*Director of the United States Patent and Trademark Office*